(12) United States Patent
Jang

(10) Patent No.: US 7,276,941 B2
(45) Date of Patent: Oct. 2, 2007

(54) POWER UP CIRCUIT OF SEMICONDUCTOR MEMORY DEVICE AND COMPENSATING METHOD THEREOF

(75) Inventor: Chae-Kyu Jang, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 116 days.

(21) Appl. No.: 11/020,309

(22) Filed: Dec. 27, 2004

(65) Prior Publication Data

US 2006/0061397 A1 Mar. 23, 2006

(30) Foreign Application Priority Data

Sep. 17, 2004 (KR) .................. 10-2004-0074562

(51) Int. Cl.
*H03L 7/00* (2006.01)
(52) U.S. Cl. .................. 327/143; 327/198
(58) Field of Classification Search .......... 327/143, 327/198
See application file for complete search history.

(56) References Cited

U.S. PATENT DOCUMENTS

| 4,717,840 A * | 1/1988 | Ouyang et al. ............. 327/143 |
|---|---|---|
| 5,420,820 A | 5/1995 | Tsay |
| 5,642,272 A | 6/1997 | McLaughlin |
| 5,754,838 A | 5/1998 | Shibata et al. |
| 5,917,255 A * | 6/1999 | Ciccone ................. 307/130 |
| 6,141,280 A | 10/2000 | Cho |
| 6,873,192 B2 * | 3/2005 | Kang et al. ............... 327/143 |
| 6,885,605 B2 * | 4/2005 | Lee et al. ................. 365/226 |
| 6,914,462 B2 * | 7/2005 | Kim et al. ................ 327/143 |
| 2003/0117875 A1 | 6/2003 | Lee et al. |
| 2004/0189357 A1 | 9/2004 | Kang et al. |
| 2005/0270077 A1 * | 12/2005 | Kwon .................... 327/143 |

FOREIGN PATENT DOCUMENTS

| JP | 9-270686 | 10/1997 |
|---|---|---|
| JP | 2003-304146 | 10/2003 |
| KR | 1998-069158 | 10/1998 |
| KR | 2000-0003605 | 1/2000 |
| KR | 2003-0027198 | 4/2003 |
| KR | 10-2004-0008796 | 1/2004 |

* cited by examiner

*Primary Examiner*—Linh My Nguyen
*Assistant Examiner*—Diana J Cheng
(74) *Attorney, Agent, or Firm*—McDermott Will & Emery LLP

(57) ABSTRACT

There is provided a power up circuit capable of outputting a power up signal delayed by a predetermined time. The power up circuit includes a voltage divider for dividing an external voltage, a delay controller for generating a control signal to control an output voltage of the voltage divider for a predetermined time by using the external voltage, and a signal generator for generating a power up signal delayed by a predetermined time by using the control signal.

22 Claims, 5 Drawing Sheets

POWER UP CIRCUIT OF SEMICONDUCTOR MEMORY DEVICE AND COMPENSATING METHOD THEREOF

FIELD OF INVENTION

The present invention relates to a power up compensating technology in a semiconductor memory device; and, more particularly, to a power up compensating technology that can rapidly stabilize a power of a semiconductor memory device.

DESCRIPTION OF PRIOR ART

FIG. 1 is a block diagram of a normal power enable sequence. Referring to FIG. 1, in a normal mode, an internal level initialization process 130 starts after a power enable process 110 and is finished before a power up enable process 120. Accordingly, in the prior art, in case where a power is enabled slowly, the internal level initialization process 130 is finished before the power up enable process 120.

FIGS. 2 and 3 are block diagrams of an abnormal power enable sequence. Referring to FIGS. 2 and 3, in case where a power is enabled fast, the initialization processes 240 and 340 do not finish before power up enable processes 220 and 320, resulting in error. That is, in the fast power enable mode, an external power VEXT rises up to an appropriate level and a power up signal rises in advance before an internal circuit is initialized, resulting in error.

FIG. 4 is a circuit diagram of a conventional power up circuit. Referring to FIG. 4, a power up signal is generated depending on a voltage of a node A. Here, a primary factor of determining the voltage of the node A is a divided voltage applied on a node B by a resistance ratio of resistors R1 and R2 (401, 402) connected in series between the external voltage VEXT and a ground voltage, and a secondary factor is a change of a MOS-type resistance 404. According to the prior art, since an increment amount of the power up signal is not changed depending on time, an error cannot be removed.

SUMMARY OF INVENTION

It is, therefore, an object of the present invention to provide a power up circuit capable of generating a power up signal delayed by a predetermined time and a compensating method thereof.

In accordance with an aspect of the present invention, there is provided a power up circuit for use in a semiconductor memory device, including: a voltage divider for dividing an external voltage; a delay controller for generating a control signal to control an output voltage of the voltage divider for a predetermined time by using the external voltage; and a signal generator for generating a power up signal delayed by a predetermined time by using the control signal.

The delay controller may include: a control voltage generating unit for generating a control voltage by using a slope of the external voltage until the external voltage is stabilized; and a first switching unit for performing a switching operation in response to the control voltage.

The control voltage generating unit may include: a first node; a capacitor connected between an external voltage terminal and the first node; and a resistor connected between the first node and a ground terminal.

The voltage divider may include first and second resistors connected in series between the external voltage terminal and the ground terminal, such that the external voltage is divided depending on a resistance ratio of the first and second resistors.

The first switching unit may be configured with a MOS transistor for controlling an output voltage of the voltage divider in response to a voltage of the first node.

The signal generator may include: a second node; a second switching unit connected between the second node and the ground terminal and controlled by the output voltage of the voltage divider; and a resistor connected between the external voltage terminal and the second node.

The resistor of the signal generator may be a MOS-type resistor.

The delay controller may include: a control voltage generating unit for generating a control voltage by using a slope of the external voltage until the external voltage is stabilized; and a first switching unit for supplying the external voltage to the voltage divider in response to the control voltage.

The voltage divider may include: a first node; and first and second resistors connected in series between an external voltage terminal and a ground terminal, such that the external voltage is divided depending on a resistance ratio of the first and second resistors and outputted to the first node.

The delay controller may further include a power compensating unit for supplying the external voltage to the first node in response to a voltage applied on the second resistor.

The control voltage generating unit may include: a second node; a capacitor connected between the external voltage terminal and the second node; and a resistor connected between the second node and the ground terminal.

The delay controller may further include a second switching unit for controlling the output voltage of the voltage divider in response to the control voltage.

In accordance with another aspect of the present invention, there is provided a power up compensating method of a semiconductor memory device, including the steps of: dividing an external voltage to output a divided voltage; generating a control voltage by using a slope of the external voltage until the external voltage is stabilized; and generating a signal for preventing an output of the divided voltage in response to the control voltage.

In accordance with a further another aspect of the present invention, there is provided a power up compensating method of a semiconductor memory device, including the steps of: generating a control voltage by using a slope of an external voltage until the external voltage is stabilized; switching to supply the external voltage in response to the control voltage; and dividing the external voltage supplied by the switching step and supplying the divided voltage.

The power up compensating method may further include the step generating a signal for preventing the output of the divided voltage in response to the control voltage.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Here in after, a power-up circuit for use in a semiconductor device in accordance with the present invention will be described in detail referring to the accompanying drawings.

Figure 1:
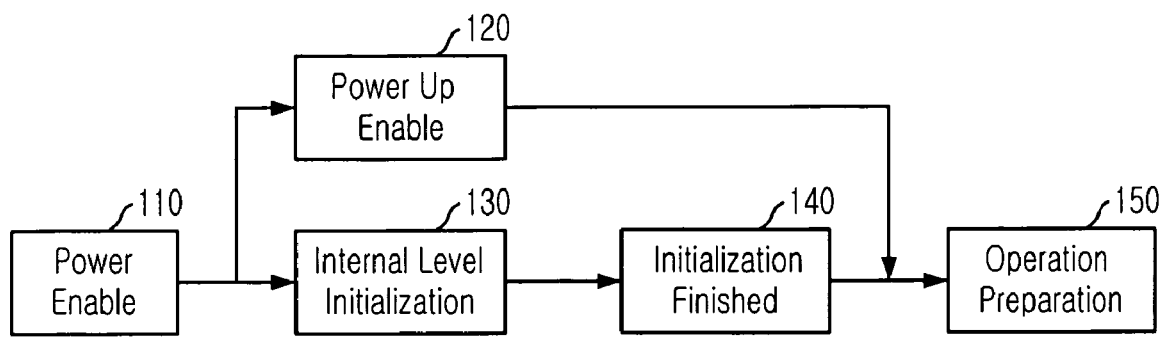
FIG. 1 is a block diagram of a normal power enable sequence.
Figure 2:
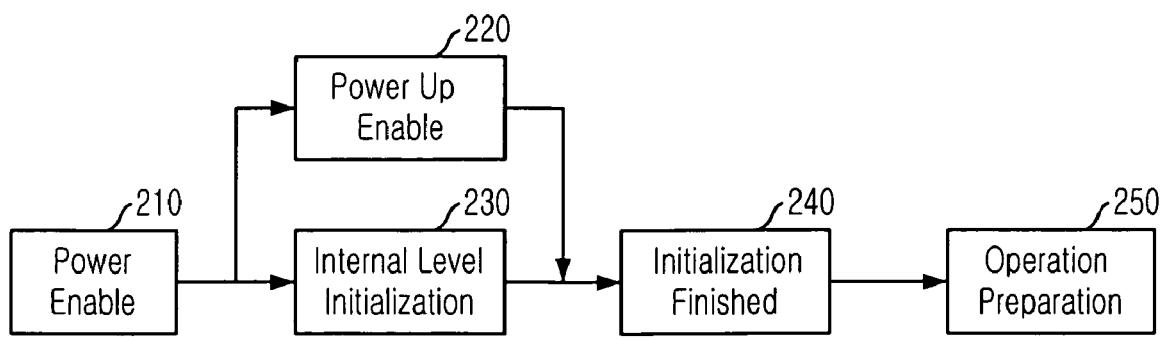
FIGS. 2 and 3 are block diagrams of an abnormal power enable sequence.
Figure 3:
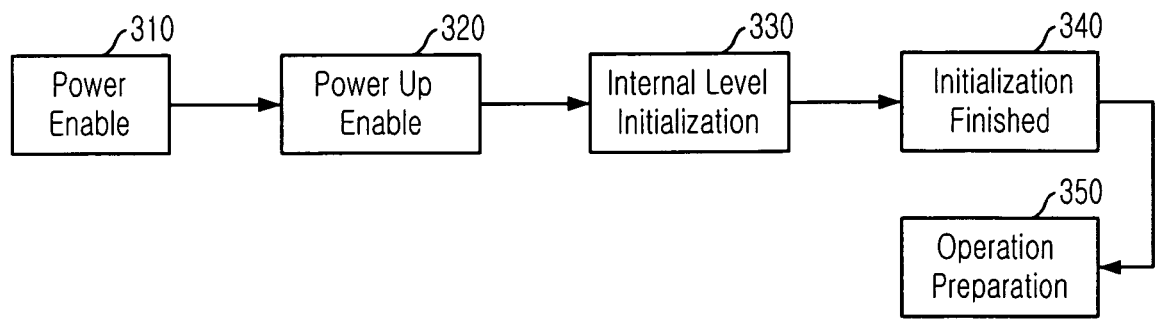
Figure 4:
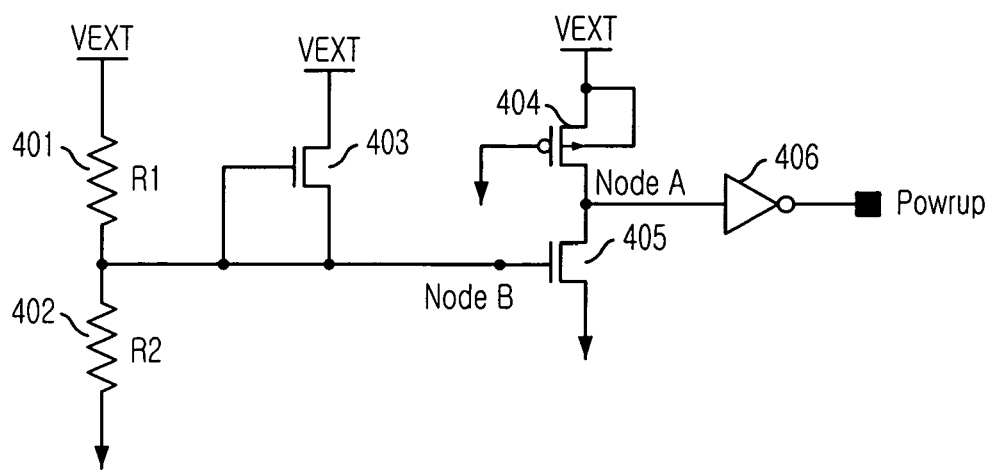
FIG. 4 is a circuit diagram of a conventional power up circuit.
Figure 5:
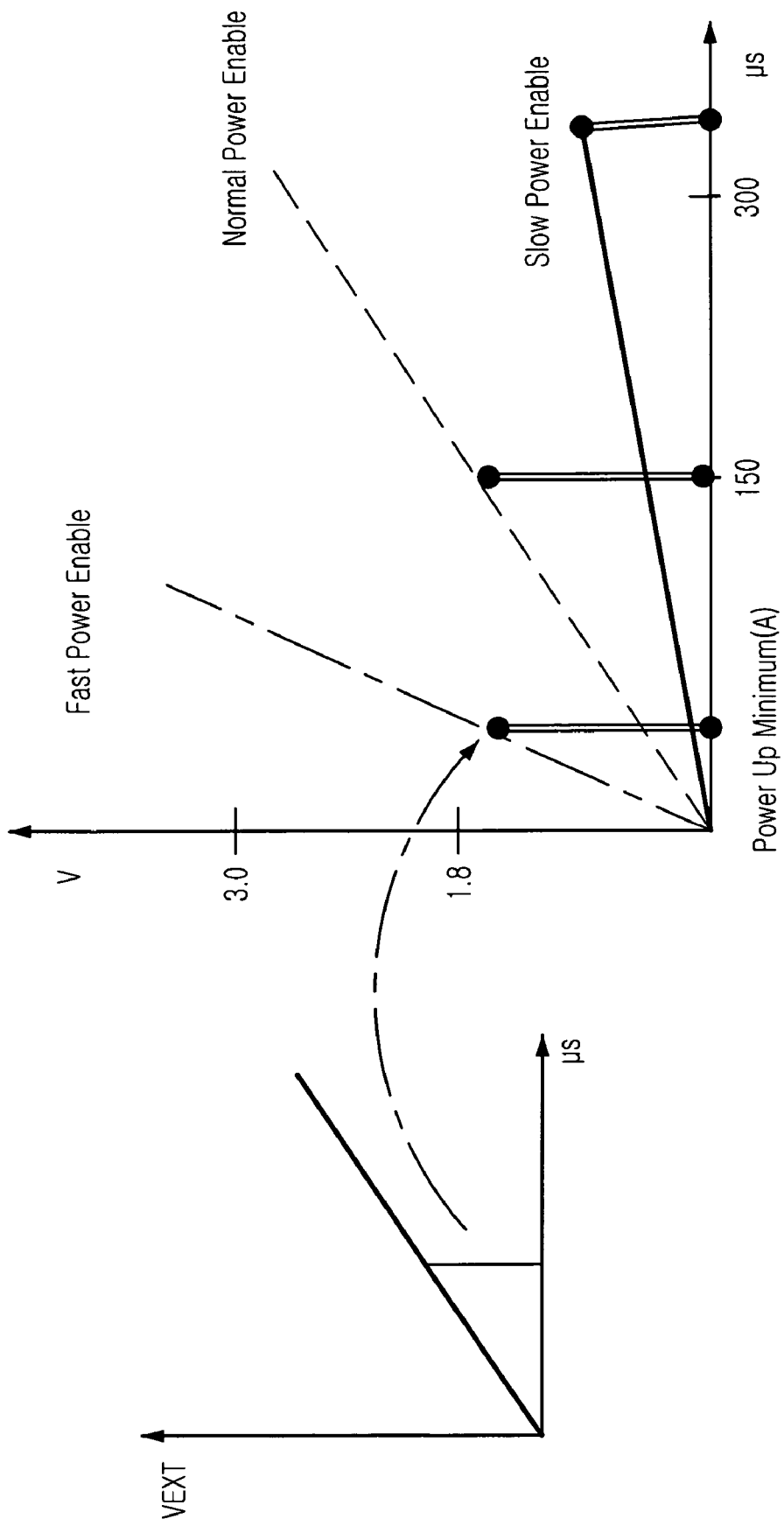
FIG. 5 is a graph showing a rising ratio of a power up signal voltage with respect to an external voltage.

FIG. 5 is a graph showing a rising ratio of a power up signal voltage with respect to an external voltage.

In more detail, FIG. 5 shows a rising ratio of a power up signal with respect to an external voltage VEXT at modes (a fast power enable mode, a normal power enable mode and a slow power enable). A power up signal voltage increases in proportion to time. Accordingly, according to the present invention, an increment amount (that is, a slope) of the power up signal voltage can be controlled in the fast power enable mode). For this purpose, an embodiment of the present invention uses a resistor and a capacitor.

Figure 6:
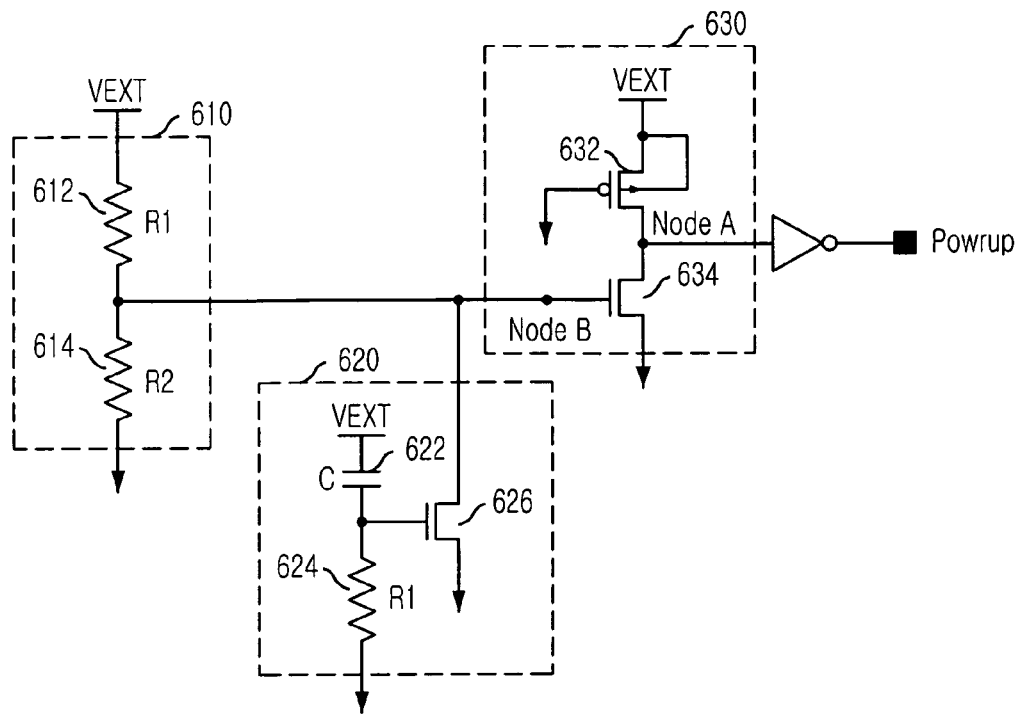
FIG. 6 is a circuit diagram of a power up circuit in accordance with a first embodiment of the present invention.

FIG. 6 is a circuit diagram of a power up circuit in accordance with a first embodiment of the present invention.

Referring to FIG. 6, the power up circuit includes a voltage divider 610 for dividing an external voltage, a delay controller 620 for generating a control signal for a predetermined time by using the external voltage, and a signal generator 630 for generating a power up signal delayed by a predetermined time in response to the control signal.

The voltage divider 610 divides the external voltage depending on a resistance ratio of first and second resistors 612 and 614 connected in series between a power supply voltage and a ground voltage.

The delay controller 620 includes a control voltage generating unit 622 and 624 and a first switching unit 626. The control voltage generating unit 622 and 624 generates a control voltage by using an incremental slope of the external voltage that rises until it is stabilized. The switching unit 626 performs a switching operation in response to the control voltage.

The control voltage generating unit can be configured with a capacitor 622 and a resistor 624.

An operation of the control voltage generating unit will be described below.

A current (Ic) flowing through the capacitor 622 is expressed as follows:

$$Ic = C \times (dV/dt)$$

For example, if C=0.1 nF and dV/dt=2V/10 μs, Ic=0.1n (2/10 μ)=20 μA.

Here, a capacitor voltage (Vc) is given as follows:

$$Vc = (1/C) \int I(t) dt$$

Meanwhile, a resistor voltage (Vr) applied across a resistor R is Vr=Ir×R and Ic≈Ic, and thus Vr≈Ic×R. That is, Vr≈R×C(dV/dt). It means that the resistor voltage is determined by a slope of the external voltage. After the external voltage is stabilized, the resistor voltage has a predetermined value until the slope of the external voltage becomes zero. For example, if Ic=20 μA and R=100 kΩ, Vr≈20 μA×100 kΩ=2 V.

Accordingly, the first switching unit 626 is turned on while the resistor voltage maintains more than a threshold voltage of the first switching unit 626. During the on-state of the first switching unit 626, the first resistor 614, the first switching unit 626 and the ground terminal form a closed circuit. Consequently, a node B on which a second resistor voltage VR2 is applied maintains a low level during the on-state of the first switching unit 626.

Since a second switching unit 634 of the signal generator 630 is in an off-state while the node B maintains a low state, the node A of the signal generator 630 maintains a high level. An inverter receives the high level of the node A and generates a power up signal of a low level. Meanwhile, a resistor disposed between the external voltage and the node A is preferably configured with a MOS-type resistor.

If the resistor voltage Vr is less than the threshold voltage of the first switching unit 626, the first switching unit 626 is turned off. Accordingly, the second resistor voltage VR2 is applied to the second switching unit 634 of the signal generator 630 to thereby turn on the second switching unit 634. If the second switching unit 634 is turned on, the node A changes to a low state. Thus, the signal generator 630 generates a power up signal of a high level. Consequently, the power up signal can be generated after the external voltage VEXT is stabilized by controlling the resistor and the capacitor even at the fast power enable mode.

Figure 7:
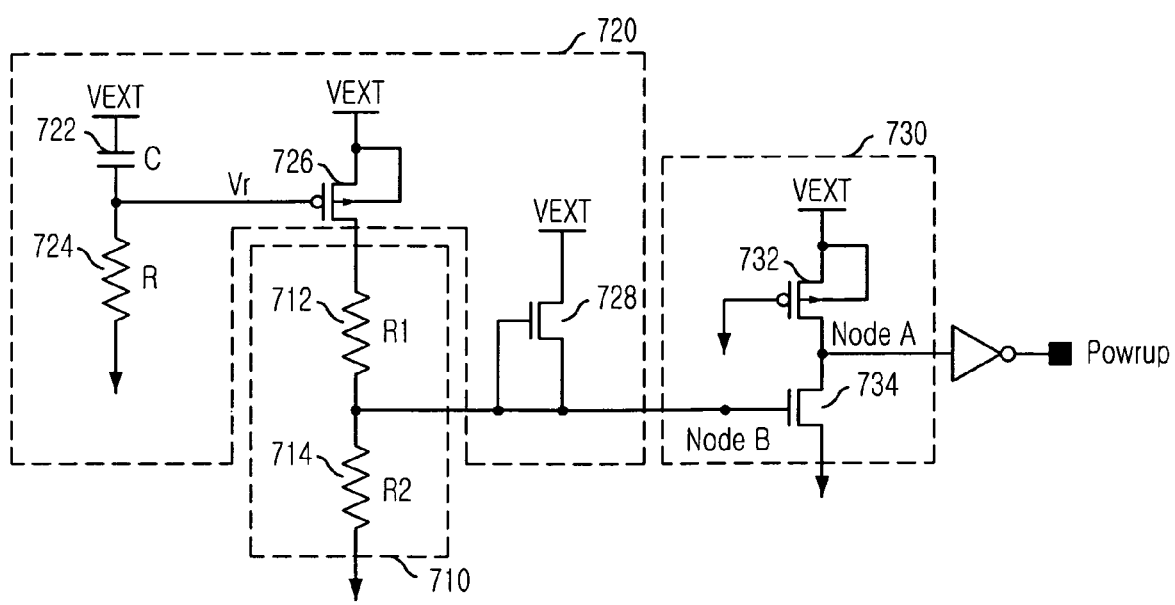
FIG. 7 is a circuit diagram of a power up circuit in accordance with a second embodiment of the present invention.

FIG. 7 is a circuit diagram of a power up circuit in accordance with a second embodiment of the present invention.

Referring to FIG. 7, the power up circuit includes a voltage divider 710 for dividing an external voltage, a delay controller 720 for generating a control signal for a predetermined time by using the external voltage, and a signal generator 730 for generating a power up signal delayed by a predetermined time by using the control signal.

The voltage divider 710 divides the external voltage depending on a resistance ratio of first and second resistors 712 and 714 connected in series between a power supply voltage and a ground voltage.

The delay controller 720 includes a control voltage generating unit 722 and 724 and a first switching unit 726. The control voltage generating unit 722 and 724 generates the control voltage by using a slope of the external voltage that rises until it is stabilized. The switching unit 626 is controlled in response to the control voltage to supply the external voltage VEXT to the voltage divider 710. Preferably, the delay controller 720 further includes a power compensating unit 728 controlled by a voltage VR2 applied on a second resistor R2 of the voltage divider 710 to compensate a level of a node B by supplying the external voltage VEXT to the node B.

A resistor voltage Vr applied on a resistor 724 of the control voltage generating unit is Vr≈R×C(dV/dt). Thus, after the external voltage is stabilized, the resistor voltage has a predetermined value until the slope of the external voltage becomes zero. The first switching unit 726 can maintain an off-state while the resistor voltage Vr has the predetermined voltage. A this point, a voltage is not applied to the second resistor R2 of the voltage divider 710 and the power compensating unit 728 is not operated, such that the node B maintains a low state.

Also, the second switching unit 734 of the signal generator 730, which is controlled by the logic state of the node B, is not operated. Since the node A maintains a high state, the signal generator 730 does not generate the power up signal.

Then, if the external voltage is stabilized and its slope approaches near zero so that the resistor voltage Vr of the control signal generator becomes near a zero voltage, the first switching unit 726 is turned on to supply the external voltage to the voltage divider. Accordingly, if the second resistor voltage is applied, the power compensating unit 728 responsive to the second resistor voltage is turned on, such that the node B changes to a high state.

At this point, the second switching unit 743 controlled by the logic state of the node B is turned on to changes the node A to a low state, thereby generating the power up signal.

Like the first embodiment of the present invention, the power up signal can be generated after the external voltage VEXT is stabilized in the fast power enable mode by controlling a time until the power up signal is generated, depending on the resistor and the capacitor.

Figure 8:
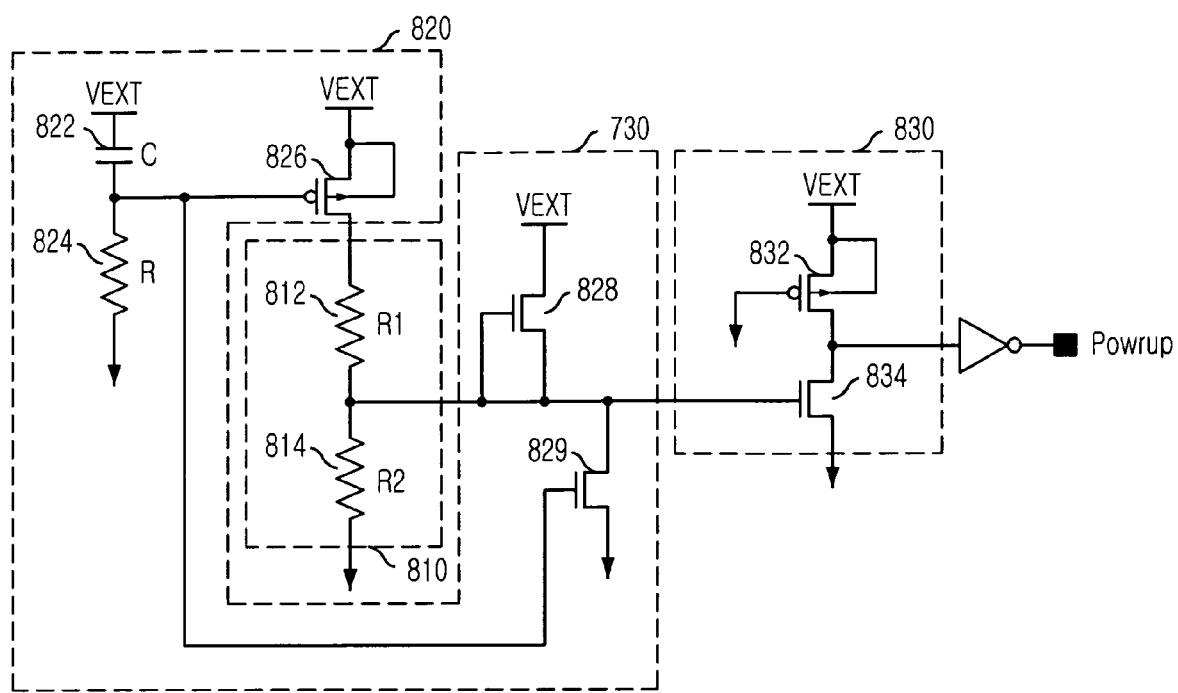
FIG. 8 is a circuit diagram of a power up circuit in accordance with a third embodiment of the present invention.

FIG. 8 is a circuit diagram of a power up circuit in accordance with a third embodiment of the present invention.

Referring to FIG. 8, the power up circuit includes a voltage divider 810 for dividing an external voltage, a delay controller 820 for generating a control signal for a predetermined time by using the external voltage, and a signal generator 830 for generating a power up signal delayed by a predetermined time by using the control signal.

This embodiment is configured by combining the delay controllers of the first and second embodiments. Since an operation of the third embodiment is the same as that of the second and third embodiments, a detailed description thereof will be omitted. Meanwhile, due to the combined structure of the first and second embodiments, the present invention can be applied to a very fast power enable mode.

In accordance with the present invention, it is possible to remove an error occurring in the initialization of the external voltage and the power up signal in the semiconductor memory device. In addition, it is possible to control an output timing of the power up signal by using a simple structure.

The present application contains subject matter related to Korean patent application No. 2004-74562, filed in the Korean Patent Office on Sep. 17, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A power up circuit for use in a semiconductor memory device, comprising:
    a voltage divider for dividing an external voltage;
    a delay controller for controlling an output voltage of the voltage divider for a predetermined time by using a slope of the external voltage; and
    a signal generator for generating a power up signal delayed by a predetermined time in response to the output voltage of the voltage divider controlled by the delay controller.

2. The power up circuit as recited in claim 1, wherein the delay controller includes:
    a control voltage generating unit for generating a control voltage by using the slope of the external voltage until the external voltage is stabilized; and
    a first switching unit controlled by the control voltage for adjusting the output voltage.

3. The power up circuit as recited in claim 2, wherein the control voltage generating unit includes:
    a first node;
    a capacitor connected between an external voltage terminal and the first node; and
    a resistor connected between the first node and a ground terminal.

4. The power up circuit as recited in claim 3, wherein the voltage divider includes first and second resistors connected in series between the external voltage terminal and the ground terminal, such that the external voltage is divided depending on a resistance ratio of the first and second resistors.

5. The power up circuit as recited in claim 4, wherein the first switching unit is configured with a MOS transistor for controlling an output voltage of the voltage divider in response to a voltage of the first node.

6. The power up circuit as recited in claim 5, wherein the signal generator includes:
    a second node;
    a second switching unit connected between the second node and the ground terminal and controlled by the output voltage of the voltage divider; and
    a resistor connected between the external voltage terminal and the second node.

7. The power up circuit as recited in claim 6, wherein the resistor of the signal generator is a MOS-type resistor.

8. The power up circuit as recited in claim 1, wherein the delay controller includes:
    a control voltage generating unit for generating a control voltage by using the slope of the external voltage until the external voltage is stabilized; and
    a first switching unit for supplying the external voltage to the voltage divider in response to the control voltage.

9. The power up circuit as recited in claim 8, wherein the voltage divider includes:
    a first node; and
    first and second resistors connected in series between the first switching unit and a ground terminal, such that voltage loaded between the first switching unit and the first resistor is divided depending on a resistance ratio of the first and second resistors and outputted to the first node.

10. The power up circuit as recited in claim 9, wherein the delay controller further includes a power compensating unit for supplying the external voltage to the first node in response to a voltage applied on the second resistor.

11. The power up circuit as recited in claim 10, wherein the control voltage generating unit includes:
    a second node;
    a capacitor connected between the external voltage terminal and the second node; and
    a resistor connected between the second node and the ground terminal.

12. The power up circuit as recited in claim 11, wherein the first switching unit is configured with a MOS transistor for supplying the external voltage to the voltage divider in response to a voltage applied on the second node.

13. The power up circuit as recited in claim 12, wherein the signal generator includes:
    a third node;
    a second switching unit connected between the third node and the ground terminal and controlled by an output voltage of the voltage divider; and
    a resistor connected between the external voltage terminal and the third node.

14. The power up circuit as recited in claim 13, wherein the resistor of the signal generator is a MOS-type resistor.

15. The power up circuit as recited in claim 10, wherein the delay controller further includes a second switching unit for controlling the output voltage of the voltage divider in response to the control voltage.

16. The power up circuit as recited in claim 15, wherein the control voltage generating unit includes:
   a second node;
   a capacitor connected between the external voltage terminal and the second node; and
   a resistor connected between the second node and the ground terminal.

17. The power up circuit as recited in claim 16, wherein the first switching unit is configured with a MOS transistor for supplying the external voltage to the voltage divider in response to a voltage applied on the second node.

18. The power up circuit as recited in claim 17, wherein the signal generator includes:
   a third node;
   a third switching unit connected between the third node and the ground terminal and controlled by the output voltage of the voltage divider; and
   a resistor connected between the external voltage terminal and the third node.

19. The power up circuit as recited in claim 18, wherein the resistor of the signal generator is a MOS-type resistor.

20. A power up compensating method of a semiconductor memory device, comprising the steps of:
   dividing an external voltage to output a divided voltage;
   generating a control voltage by using a slope of the external voltage until the external voltage is stabilized; and
   generating a signal for preventing an output of the divided voltage in response to the control voltage.

21. A power up compensating method of a semiconductor memory device, comprising the steps of:
   generating a control voltage by using a slope of an external voltage until the external voltage is stabilized;
   switching to supply the external voltage in response to the control voltage; and
   dividing the external voltage supplied by the switching step and supplying the divided voltage.

22. The power up compensating method as recited in claim 21, further comprising the step generating a signal for preventing the output of the divided voltage in response to the control voltage.

* * * * *